United States Patent [19]

Nishizawa

[11] 4,359,012
[45] Nov. 16, 1982

[54] APPARATUS FOR PRODUCING A SEMICONDUCTOR DEVICE UTILIZING SUCCESSIVE LIQUID GROWTH

[75] Inventor: Jun-ichi Nishizawa, Sendai, Japan

[73] Assignee: Handotai Kenkyu Shinkokai, Sendai, Japan

[21] Appl. No.: 152,309

[22] Filed: May 22, 1980

Related U.S. Application Data

[63] Continuation of Ser. No. 871,113, Jan. 19, 1978, abandoned, which is a continuation-in-part of Ser. No. 587,137, Jun. 16, 1975, abandoned, which is a continuation of Ser. No. 423,301, Dec. 10, 1973, abandoned.

[51] Int. Cl.$^3$ .......................................... H01L 21/208
[52] U.S. Cl. ...................................... 118/59; 118/412; 118/415
[58] Field of Search ............... 118/411, 412, 415, 422, 118/421, 59, 69, 425; 148/171, 172; 23/273 SP; 156/622, 623

[56] References Cited

U.S. PATENT DOCUMENTS

| | | | |
|---|---|---|---|
| 3,665,888 | 5/1972 | Bergh et al. | 118/415 X |
| 3,692,592 | 9/1972 | Marinelli | 118/412 X |
| 3,762,943 | 10/1973 | Winstel et al. | 148/171 X |
| 3,785,884 | 1/1974 | Lockwood | 118/415 X |
| 3,933,538 | 1/1976 | Akai et al. | 148/171 |

Primary Examiner—John P. McIntosh
Attorney, Agent, or Firm—Cushman, Darby & Cushman

[57] ABSTRACT

An apparatus for producing a semiconductor device of epitaxial growth on a substrate utilizing successive solution growth, in which materials to be successively deposited are being dissolved in bore portions respectively interconnecting between holes of the higher temperature portion and holes of the lower temperature portion in a boat, and in which a cooling jig is coupled with the substrate provided at the hole of the lower temperature portion to effectively conduct substantially main part of heat of the dissolved materials through the substrate.

12 Claims, 14 Drawing Figures

APPARATUS FOR PRODUCING A SEMICONDUCTOR DEVICE UTLIZING SUCCESSIVE LIQUID GROWTH

CROSS REFERENCE TO RELATED APPLICATION

This is a continuation of my copending application Ser. No. 871,113, filed Jan. 19, 1978, now abandoned, which was a continuation-in-part of my copending application Ser. No. 587,137 filed on June 16, 1975, abandoned after the filing hereof and which was a Rule 60 continuation of my great grandparent application Ser. No. 423,301 filed Dec. 10, 1973, now abandoned.

BACKGROUND OF THE INVENTION (a) Field of the Invention:

The present invention relates to an apparatus for producing semiconductor devices by the liquid phase epitaxial technique and more particularly to a structure for dissipating heat from a solution of semiconductive material in molten metal solvent through a substrate.

(b) Description of the Prior Art:

Thre have been developed two types of solution growth techniques for producing semiconductor devices, one of which is called "a cooling method" wherein a surface of the substrate is brought into contact with a solution of a semiconductive material in a molten metal solvent and the temperature of the solution is lowered during the deposition of the semiconductive material on the substrate. The other is a very recently developed technique called "a temperature difference method" in which, as disclosed in my copending application Ser. No. 862,978 filed Dec. 21, 1977 and its abandoned parent and grandparent applications Ser. Nos. 561,092 filed Mar. 24, 1975 and 314,448 filed Dec. 12, 1972 (the contents of all three of which are incorporated hereinto by reference), a constant temperature difference is established between an upper portion and a lower portion of a well or reservoir containing the solution, and the deposition of epitaxial layers on the substrate is conducted without requiring any lowering of the temperature of the solution.

In the cooling method, if the solution cools faster than the surface of the substrate, the deposited epitaxial layer becomes non-planar. In order to overcome this difficulty, U.S. Pat. No. 3,665,888 issued to Bergh et al teaches the use of heat sink means, through which flows a cooled inert gas, under a substrate-accommodating portion of a slider to establish a vertical temperature gradient via the heat sink. Similarly, U.S. Pat. No. 3,785,884 issued to Lockwood et al discloses a container provided with a heat radiation window therethrough with a substrate seated over the window and a plate of sapphire or quartz placed between the substrate and the window. However these approaches to overcome the difficulty are not so effective to obtain a stable and planar growth of the epitaxial layer when they are applied to the apparatus for successive growth of multi-layer structures on a plurality of substrates by using the temperature difference method, because in the latter method the deposition end of the well is maintained at a predetermined temperature lower than that of the upper end thereof and a constant temperature difference is maintained between both ends during the deposition of epitaxial layers so that a much higher amount of heat dissipates through a region on the periphery of the substrate compared with that in the cooling method.

For example, the cooling heat sink proposed by Bergh extends very far from the substrate-containing region of the slide so that it absorbs a much higher amount of heat through a region on the periphery of the substrate than that through the substrate itself, when it is used in an apparatus according to the temperature difference method. The window and a sapphire or quartz plate proposed by Lockwood are rather less heat-conductive than carbon. Therefore, they adversely affect the heat dissipation through the substrate. On the other hand, in the temperature difference method, Akai teaches the use of heat sink as disclosed in U.S. Pat. No. 3,933,538. However, this heat sink is provided on the bottom surface of the sliders over a very wide range such as a distance including three substances, so that it can not have any effect of dissipating most of the heat through the substrate.

Moreover, Bergh teaches the art that, after a thermal equilibrium has been established between a substrate and a source-saturated melt, a cooled inert gas is caused to flow through a heat exchanger to produce a reduction of the temperature of the substrate. Hence, for each replacement of a crystal-deposited substrate by a fresh substrate of which a crystal is to be epitaxially deposited, Bergh must repeat his cycle which consists of: heating to achieve the thermal equilibrium and cooling to cause a reduction in temperature. Such repetition of the heating-cooling cycle in Bergh is very troublesome in practice.

U.S. Pat. No. 3,762,943 issued to Winstel et al teaches the use of a finger type of heat sink in a vertically extending apparatus which creates a thermal resistance which increases toward the center of this finger. The temperature gradient is established only in the axial directions and not in the radial direction. This technique cannot be applied to an apparatus of the horizontally-extending type used for effecting the temperature difference method to which the present invention is directed, because the condition of heat flow through the apparatus is entirely different from that in the Winstel apparatus. Thus, in the horizontally-extending type apparatus where a temperature difference is maintained between the upper portion and the lower portion of a melt according to the temperature difference method, the thermal resistance at the center of the substrate between the substrate and the heat sink must be as small as possible as compared with the thermal resistance on the outside of the periphery portions of the substrate so as to effect a vertical flow of heat substantially only through the substrate. This is entirely the reverse of the Winstel teaching.

SUMMARY OF THE INVENTION

In order to overcome the above difficulty, in the temperature difference method, there is provided by the present invention heat sink means which is capable of effectively confining an area, through which heat dissipates from the solution, to within the solution-containing surface of the substrate.

Therefore, an object of the present invention is to provide an apparatus for producing semiconductor devices by the temperature difference method which has a structure making possible a powerful heat conduction underwardly through the solution-contacting surface of the substrate to achieve a stable and planar growth of the epitaxial layer by the temperature difference method.

According to one detailed embodiment of the present invention, there is provided in apparatus for successively producing identical semiconductor devices each of which has a multilayer structure including a plurality of epitaxial layers successively deposited on a substrate by the temperature difference method, boat means having a plurality of wells corresponding to the desired number of epitaxial layers to be deposited, each well having an upper portion, a lower portion and a passage interconnecting both portions, movable slider means carrying a plurality of substrates each accommodated in one of a plurality of slots formed on one surface of said slider means, the slider means being arranged so that its substrate carrying surface is brought into substantially coplanar relation with a lower open end of said lower portion as the slider means is moved successively to establish abutment of the lower open end and the substrate contained in the slot, all as proposed in my prior applications mentioned above. In the present invention, cooling means is provided under the slider means and is part of the overall means which creates the temperature difference method of operation in this invention. In one embodiment the improvement is characterized by the lower open end of each well having a smaller cross sectional area than an upper surface area of said substrate, with the slider means being made of quartz and capable of accommodating the substrate in such a manner that a lower surface of the substrate is coplanar with that of the slider means. The cooling means is made of heat conductive material having an upper contacting surface area not smaller than that of the lower surface area of the substrate. In one embodiment the upper contacting surface area of the cooling means is of the same magnitude as that of the lower surface area of said substrate, and in another it is substantially larger on all sides. In any event, the cooling means has an internal path for passing a flow of cooling fluid and is disposed so that its upper contacting surface area is substantially coplanar with the lower surface area of the slider means with the center of the cooling means being substantially on a line along the central axis of said lower portion of the well.

In one embodiment of the present invention, the slider means may have a bottom plate in the slot, on which the substrate is placed. The bottom plate may be made of quartz or carbon.

In another embodiment of the present invention, the slider means may be made of carbon and the cooling means has a projected upper surface area of the same magnitude of that of the lower surface area of the substrate.

In still another embodiment of the present invention, the boat is composed of a central portion provided with a well and side walls, at least two opposite walls of which are made of a hollow quartz body.

In the above embodiments, the path in the cooling means may be composed of a hole hollow bored therethrough or a pipe embedded therein.

The present invention will be more in detail described with reference to drawings.

DETAILED DESCRIPTION OF THE PREFERRED EMBODIMENTS

Figure 1A:
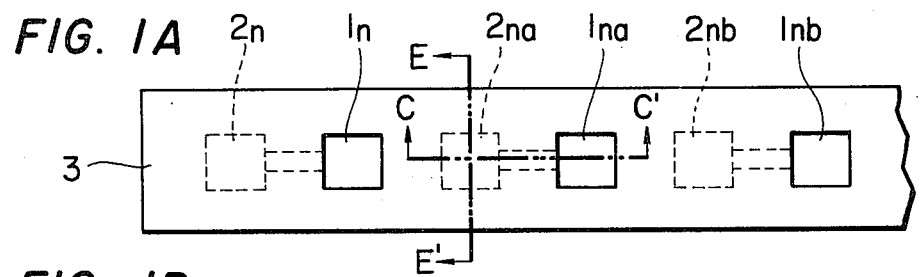
FIG. 1A is a diagrammatic plan view of a portion of a boat used in an embodiment of the apparatus according to the present invention.

An apparatus for producing a semiconductor device utilizing the successive liquid growth technique in accordance with this invention comprises a boat 3 having a hole 1 at the higher temperature portion and a hole 2 at the lower temperature portion for each furnace, a substrate 4 held at the hole 2 of the lower temperature portion, a cooling jig 5 disposed at the underside of the substrate 4, and a heat-insulating slide plate 6 disposed around the substrate 4. The cooling jig 5 and the heat-insulating slide plate 6 may be formed as a unitary structure with each other or may also be separately formed.

In the apparatus of this invention for producing the semiconductor device utilizing the successive, liquid-growth technique, a material to be deposited is being dissolved at a hole 1 of the higher temperature portion, which is interconnected by a bore portion to a hole 2 of the lower temperature portion, while a jig 5 is provided to remove heat of the dissolved material through a substrate 4 positioned at the bottom of the hole 2 of the lower temperature portion, thereby performing epitaxial growth on the substrate 4.

Figure 1B:
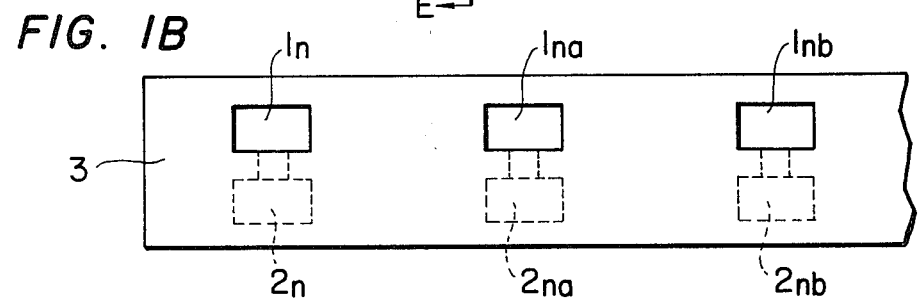
FIG. 1B is a diagrammatic plan view of another type of boat used in an embodiment of the apparatus according to the present invention.
Figure 1C:
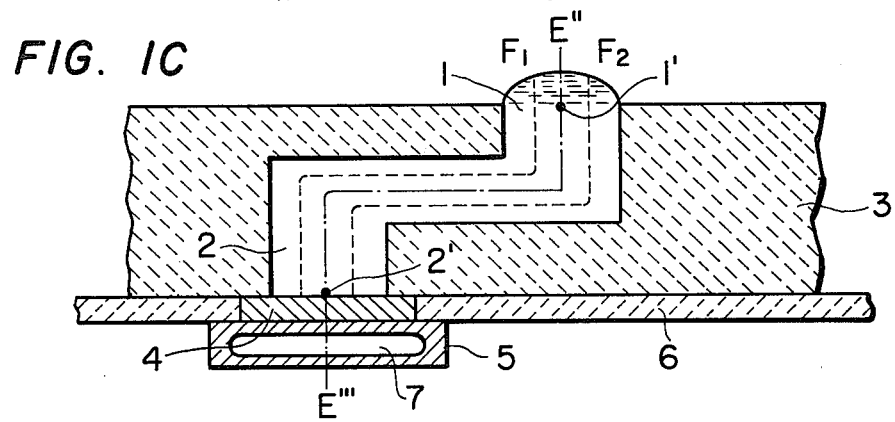
FIG. 1C is a cross sectional view taken along a line C—C' of FIG. 1A, in which the well as a whole is modifed generally into a cylindrical form.
Figure 1D:
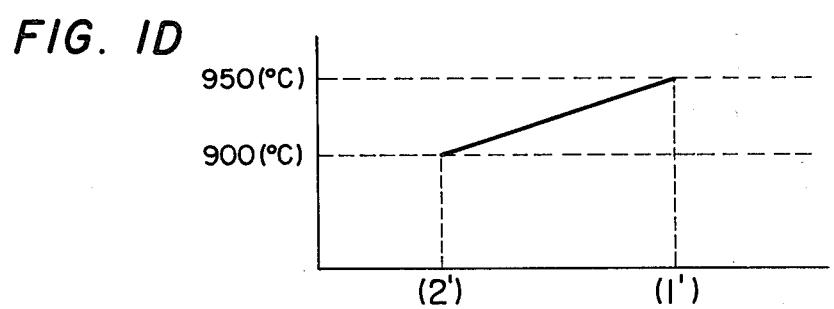
FIG. 1D is a graph showing a temperature gradient established between an upper open end and a lower deposition end of the well shown in FIG. 1C.
Figure 1E:
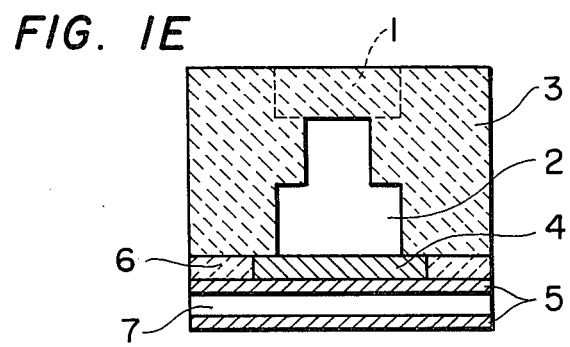
FIG. 1E is a cross sectional view taken along a line E—E' of FIG. 1A, in which the well as a whole is modified generally into a cylindrical form.

In the example shown in FIGS. 1C and 1E, the boat 3 is made of carbon, and FIG. 1D shows an exemplary temperature gradient established between points 1' and 2'. The required elevated temperature for the higher temperature hole 1, for example in the 850° C. to 950° C. range, may be obtained with conventional heating means such as described in my prior applications above mentioned; that is, a quartz tube vacuum furnace with a conventional tubular resistance furnace having separate upper and lower heating shells. While such shells may be operated at different temperatures to help establish the required lower temperature for hole 2 as in my prior invention, preferably those shells are operated at the same temperature for this invention with the cooling jig 5 aiding or causing the predetermined constant temperature difference between holes 1 and 2, i.e., the predetermined temperature gradient from hole 1 down to hole 2 as shown in FIG. 1D.

In the interconnected higher temperature hole 1 and the lower temperature hole 2, GaAlAs or GaAs, for example, is dissolved as a solute in a solvent, for example, Ga, and the substrate 4 of monocrystalline GaAs is disposed at the bottom of the hole 2 on the lower temperature side.

In order that the streamlines F1 and F2 in FIG. 1C, which represent the flow of heat, may pass directly through the substrate 4 and cannot pass through or around the peripheral area thereof, the cooling jig 5 is disposed on the underside of the monocrystalline substrate 4, and the slide plate 6 made of a heat-insulating material is placed around the substrate 4, thereby preventing direct flow of heat from the boat 3 to the cooling jig 5. Consequently, heat flows through the substrate 4 to ensure that all the supersaturated solute is recrystalized on the substrate 4 with a very good yield rate. A plate of quartz or the like may be used as the slide plate 6 in which case the crystal face of the substrate 4 is, as shown, wider than the section of the hole 2 to prevent contact of the quartz with the solvent, Ga, and thus avoid dissolution of the quartz in the same solvent.

A typical size of the apparatus is as follows: for example, the boat 3 has a width of 25 millimeters (mm) in FIG. 1A and a height of 30 mm; the hole 1 on the higher temperature side has a diameter of 15 mm; the hole 2 on the lower temperature side has a diameter of 10 mm; the interconnecting part between the holes 1 and 2 has a diameter of 5 mm and a length of 20 mm; and the cooling jig 5 has a size of 30 mm width by 5 mm height. The cooling jig 5 completely covers substrate 4 and in this embodiment the cooling jig 5 has an upper surface area which is substantially larger on all sides than the lower surface area of substrate 4, which in turn is larger in area than hole 2 and extends beyond hole 2 on all sides.

In the drawings, a reference numeral 7 indicates a cooling path in the jig 5 for passing therethrough a cooling medium, such as water or a gas.

FIG. 1C shows the case of one crystalline layer growth in the successive liquid phase growth. FIGS. 1A and 1B illustrate practical multi-layer growth devices of this invention, in each of which cases a plurality n of wells each corresponding to the well depicted in FIG. 1C are provided. In FIGS. 1A and 1B, reference numerals 1n, 1na and 1nb designate holes on the higher temperature side; 2n, 2na and 2nb holes on the lower temperature side; and 3 a boat.

The foregoing has described the case where the boat 3 is formed of carbon, but the following will describe a case with a boat made of platinum.

In general, the jig may be made of carbon, but carbon cannot be formed into a thin thickness, and hence is defective in that its thermal conductivity is relatively large. Alternatively, while complicated in construction, the jig may be formed of platinum which does not react with Ga and can be used at high temperature.

Figure 2A:
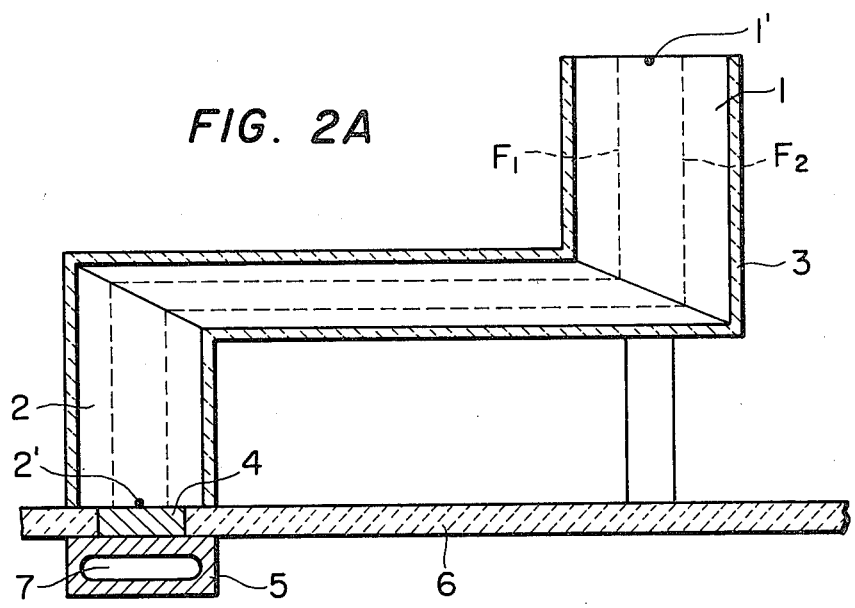
FIG. 2A is a fragmmental diagrammatic longitudinal cross sectional view of another type of a boat used in an embodiment of the apparatus according to the present invention.
Figure 2B:
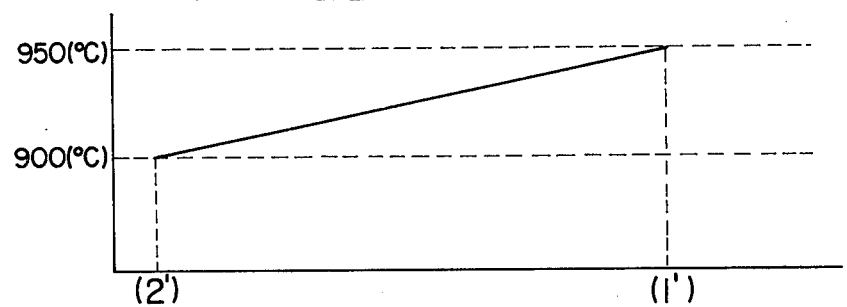
FIG. 2B is a graph showing a temperature gradient established between an upper open end and a lower deposition end of the boat shown in FIG. 2A.

FIG. 2A shows another example of the apparatus of the present invention using a boat 3 of platinum. The temperature at the hole 1 on the higher temperature side is held higher than that at the hole 2 on the lower temperature side. In the bore portion interconnecting the holes 1 and 2, a solute such as GaAlAs, is dissolved in a solvent, for example, Ga, and the substrate 4 of monocrystalline GaAs is placed at the hole 2 on the lower temperature side.

In order that the F1 and F2 streamlines representing the flow of heat in FIG. 2A may pass through the monocrystalline GaAs substrate 4 and may not pass through or around the peripheral area of the substrate 4, the cooling jig 5 is disposed on the underside of the substrate 4, and the slide plate 6 made of a heat-insulating material is disposed around the substrate 4, thereby preventing direct flow of heat from the boat 3 to the cooling jig 5. As a result of this, heat flows through the substrate 4 to ensure that all the supersaturated solute is recrystallized on the substrate 4 with a very good yield rate.

The cooling jig 5 is formed of platinum or carbon as mentioned above and the cooling medium in the cooling path 7 is water or gas. In the case of the jig 5 being of platinum, the size of the jig can be formed with thinner walls than in the case of a carbon jig, and heat flows through the crystal substrate as in the case of a carbon jig.

A typical size of the apparatus is as follows: for example, the boat 3 has a width (i.e., depth) of 25 mm and a height of 25 mm; the holes 1 and 2 have diameters of 15 mm and 10 mm, respectively; the interconnecting portion between the holes 1 and 2 has a diameter of 5 mm and a length of 20 mm; and the cooling jig has a size of 15 mm width by 5 mm height.

Although the above example has been described in connection with one crystalline layer growth, in the case of producing multilayer semiconductor devices utilizing the successive liquid phase growth technqiue, a plurality n of one-layer growth portions (surfaces) are provided a desired distance apart from each other as shown in FIGS. 1A and 1B.

Figure 3:
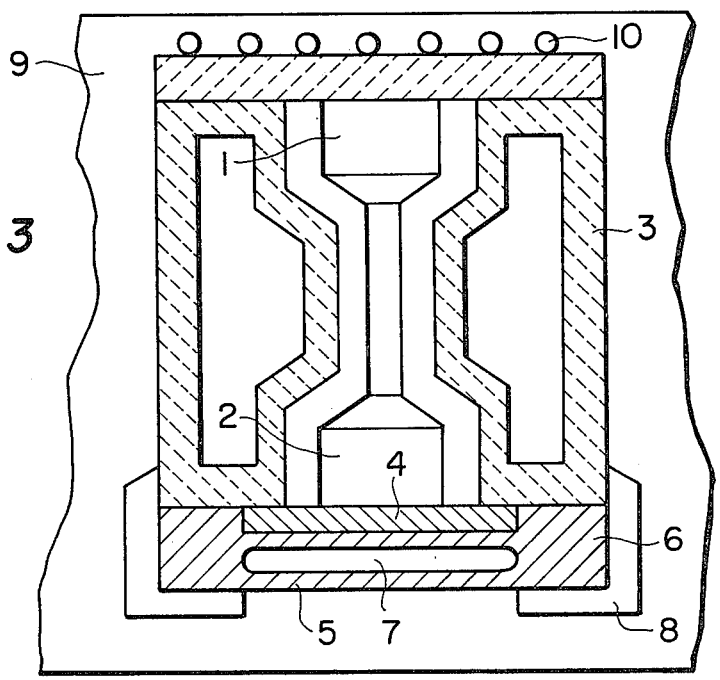
FIG. 3 is a diagrammatic vertical cross sectional view of another embodiment of the apparatus according to the present invention.

FIG. 3 illustrates a still another example of the present invention. In a horizontal type furnace 9, holes 1 and 2 on the higher and lower temperature sides respectively are arranged in a vertical direction, and the upper part of a boat 3 is directly heated by an auxiliary heater 10. A substrate 4 of monocrystalline GaAs is placed at the hole 2 on the lower temperature side. In order to prevent leakage of heat in a lateral direction and hence ensure effective heat conduction in a downward direction, the boat 3 is sealed with hollow, annular quartz members around each well, e.g. member 3', which are maintained in a vacuum condition and disposed at the periphery of the jig 5. Plating the interior side of the quartz with silver will further prevent the lateral leakage of heat.

The auxiliary heater 10 may be formed of, for example, molybdenum.

A typical size of this apparatus is as follows: for example, the boat 3 has a width of 25 mm and a height of 30 mm; the holes 1 and 2 on the lower and higher temperature sides respectively have diameters of 15 mm and 10 mm, respectively, and a length of 15 mm; the bore portion interconnecting between the holes 1 and 2 has a diameter of 5 mm and a length of 20 mm; and the support 8 has a height of 5 mm.

The cooling part may be a solid rod of carbon or a carbon jig having embedded therein a cooling water pipe or a pipe for flowing a gas such as hydrogen gas. Further, the cooling jig 5 and the slide plate 6 of a heat-conductive material may be formed integrally with each other or separately from each other, and are held by support 8.

Figure 4A:
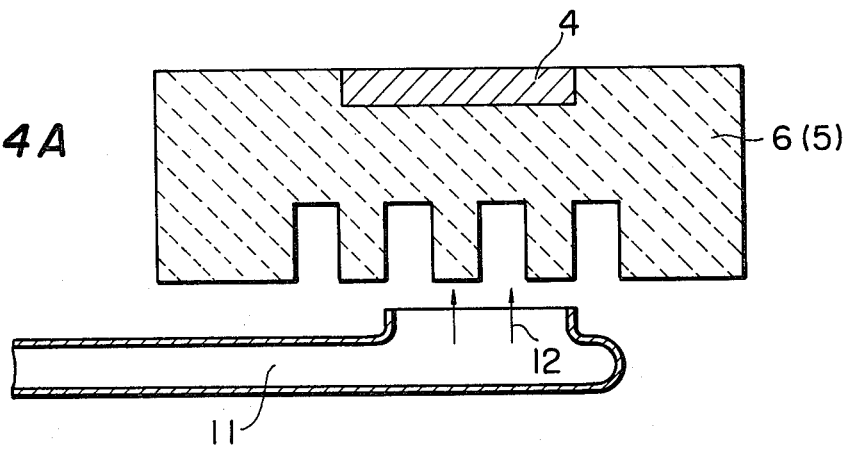
FIG. 4A is a diagrammatic cross sectional view of another embodiment of cooling means according to the present invention.
Figure 4B:
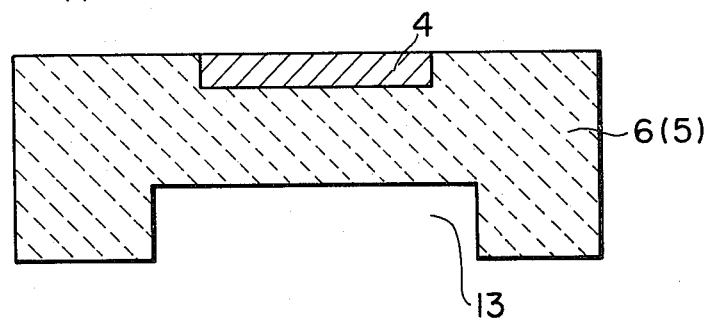
FIG. 4B is a diagrammatic cross sectional view of another embodiment of cooling means according to the present invention.

FIGS. 4A and 4B, as well as FIG. 3 show the slide plate 6 and the cooling jig 5 formed integrally with each other.

FIG. 4A illustrates the case where a gas 12, such as hydrogen gas or the like, is blasted up to the underside of the slide plate 6 of the heat insulator from a gas blower 11.

FIG. 4B is the case where the part of the jig underneath the substrate is formed to have a thin thickness so as to utilize the cooling effect of a gas flowing in a furnace 13 instead of using the gas blower 11.

It is a matter of course that the sizes, shapes and arrangements of the holes 1 and 2 are selected at will in accordance with design conditions and so on.

In accordance with this invention, the yield rate at the production of semiconductor diodes, such as semiconductor luminescent diodes or the like, requiring a plurality of epitaxial layers is effectively improved as clearly understood from the above description. Moreover, the surface concavity is substantially reduced or eliminated and hence the flatness of the grown layer and its homogeneity are enhanced, so that semiconductor devices of high efficiency can be obtained by the use of the apparatus of the present invention.

Figure 5A:
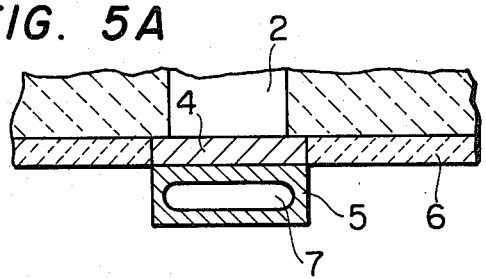
FIGS 5A–5C show still further embodiments of the invention, FIG. 5C being a cross sectional view along line C—C' of FIG. 5D.

FIG. 5A shows another embodiment of the present invention wherein slide plate 6 is made of quartz and cooling jig 5 has substantially the same width as that of substrate 4. In this case, the substrate must therefore be wider than the lower hole 2, on all sides.

Figure 5B:
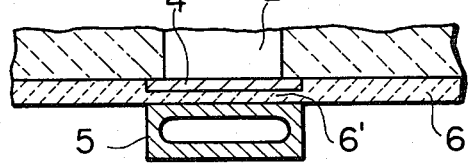

FIG. 5B shows still another embodiment of the present invention wherein the slot provided in the slide plate has a bottom plate 6' on which the substrate 4 is placed. The slide plate may be made of quartz or carbon. The cooling jig 5 has substantially the same width as that of substrate 4 which on all sides is wider than hole 2.

Figure 5C:
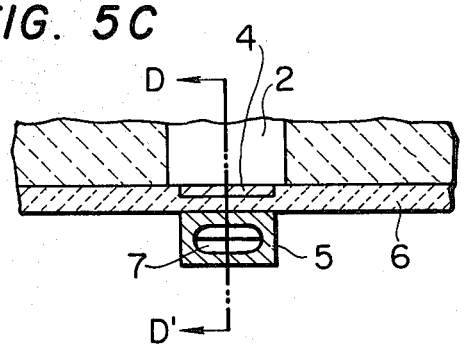
Figure 5D:
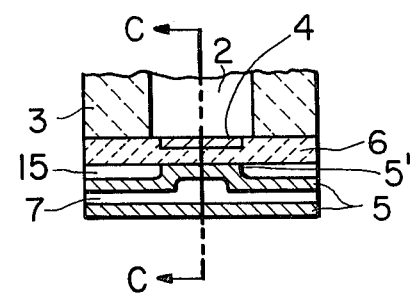
FIG. 5D is a cross sectional view along a line D—D' of FIG. 5C.

FIG. 5C shows still another embodiment of the present invention wherein slide plate 6 is made of carbon and has a recess for accommodating substrate 4. In this case, the cooling jig or pipe 5 has substantially the same width as that of the substrate and a projected portion 5' of substantially the same length as that of the recess, the upper surface of which projected portion is in contact with the lower surface of the slide plate as clearly shown in FIG. 5D taken along a line D—D' of FIG. 5C. Space 15 to the side of the projected portion 5' is a heat insulating air gap which prevents the downward flowing heat from going outside of the projected portion 5', but instead it causes it to go fully through the projected portion 5' for eliminating surface concavity and enhancing flatness of the layer grown on the substrate 4. The width and the length of the substrate may be shorter than those of the lower hole 2.

What is claimed is:

1. In an apparatus for successively producing at least two semiconductor devices each having a multilayer structure including a plurality of epitaxial layers deposited successively on a substrate by the temperature difference method, the improvement comprising a combination structure having:

boat means having a plurality of substantially vertically disposed wells for containing solutions to be deposited and corresponding in number to at least the number of epitaxial layers to be deposited, temperature difference establishing means for causing said solutions contained in the wells to have different temperatures at their upper and lower portions to establish in each well a downwardly decreasing temperature difference between said upper and lower portions thereof, a plurality of substrates spacedly disposed in a horizontal direction, horizontally movable substrate conveyor means for conveying said substrates into successive contact with respective lower ends of said plurality of wells upon movement of said conveyor means in said horizontal direction, and cooling means included in said establishing means and being disposed under said wells below said substrate conveyor means, said cooling means having at least in part a cross sectional area which is surrounded by heat insulating space and has substantially the same area as the lower surface and said substrate and being heat conductive for reducing surface concavity to enhance the flatness of each deposited epitaxial layer by preventing said heat substantially from bypassing said substrate in its downward flow and causing substantially all of the heat from said solution to transmit through said substrate into said cooling means, and said temperature difference establishing being operative to hold said different temperatures and temperature difference at each well substantially at their established values not only during each said deposition but throughout the whole time required to produce all said semiconductor devices including before, during and after each movement of said conveyor means.

2. In an apparatus for successively producing at least two semiconductor devices each having a multilayer structure including a plurality of epitaxial layers deposited successively on a substrate by the temperature difference method, the improvement comprising:

boat means having a plurality of substantially vertically disposed wells for containing solutions to be deposited and corresponding in number to at least the number of epitaxial layers to be deposited;

a plurality of substrates disposed in a horizontal direction;

substrate conveyor means for conveying said substrate into successive contact with respective lower ends of said plurality of wells, said solutions contained in the wells each having a downwardly decreasing temperature difference between upper and lower portions thereof, and cooling means disposed below said substrate conveyor means to cause a downward flow of heat from said solutions to said cooling means, the improvement wherein:

heat insulation forming and directing means are included as part of one of said conveyor and cooling means and comprise at each depositing well a vertically extending portion disposed squarely under a respective well with an upper horizontal cross sectional size and area corresponding to that of the respective substrate for providing a heat insulating space surrounding said vertical portion to prevent said downward flow of heat substantially from bypassing its respective substrate in its downward flow and to guide substantially all that heat through that substrate and vertical portion into said cooling means while that substrate is under a said well during a temperature differential epitaxial deposition therefrom for eliminating concavity in the surface of each said epitaxial layer as it is deposited and enhancing the flatness thereof.

3. Apparatus as in claim 2 including temperature difference establishing means for causing said solutions contained in the wells to have different temperatures at their upper and lower portions to establish in each well said downwardly decreasing temperature difference between said upper and lower portions thereof and to hold said different temperatures and temperature difference at each well substantially at their established values not only during each said deposition but throughout the whole time required to produce all said semiconductor devices including before, during and after each movement of said conveyor means.

4. Apparatus as in claim 1, 2 or 3 wherein:
said cooling means is in direct contact with the said lower surface of each said substrate.

5. Apparatus as in claim 1, 2 or 3 wherein:
said cooling means is in direct contact with the lower side of said substrate conveyor means beneath each said substrate.

6. Apparatus as in claim 1, 2 or 3 wherein:
said cooling means is made of a solid heat conductive material.

7. Apparatus as in claim 1, 2 or 3 wherein:
said cooling means is made of a hollow heat conducting material for passing cooling fluid therethrough.

8. Apparatus as in claim 1, 2 or 3 wherein:
said cooling means has an upwardly projecting portion which has said cross sectional area and connects with the lower surface of said conveyor means beneath said substrate, said heat insulating space surrounding said projecting position.

9. Apparatus as in claim 8 wherein:
said cooling means is made of a solid heat conductive material and said conveyor means and cooling means are constructed integrally.

10. Apparatus as in claim 1, 2 or 3 wherein said cooling means is constructed of a pipe made of heat conductive material, through which a cooling fluid is passed, and has an upper surface a portion of which has said cross sectional area and makes a gapless void-free connection with the lower surface of at least one of said substrate and conveyor means.

11. Apparatus as in claim 10 wherein:
said portion is a projecting portion of the upper wall of said pipe and is in contact with the lower surface of said conveyor means, said heat insulating space being formed around said projecting portion.

12. Apparatus as in claim 11 wherein:
said cooling means is made of solid heat conductive material and said conveyor means and cooling means are constructed integrally.

* * * * *